(12) United States Patent
Sudhakaran et al.

(10) Patent No.: US 10,594,337 B2
(45) Date of Patent: Mar. 17, 2020

(54) MAXIMUM TRANSITION AVOIDANCE (MTA) ENCODING

(71) Applicant: NVIDIA Corp., Santa Clara, CA (US)

(72) Inventors: Sunil Sudhakaran, Brisbane, CA (US); Russ Newcomb, Morgan Hill, CA (US); Rohit Rathi, Milpitas, CA (US)

(73) Assignee: NVIDIA Corp., Santa Clara, CA (US)

( * ) Notice: Subject to any disclaimer, the term of this patent is extended or adjusted under 35 U.S.C. 154(b) by 2 days.

(21) Appl. No.: 16/557,637

(22) Filed: Aug. 30, 2019

(65) Prior Publication Data

US 2019/0386677 A1   Dec. 19, 2019

Related U.S. Application Data

(62) Division of application No. 16/124,085, filed on Sep. 6, 2018.

(60) Provisional application No. 62/621,056, filed on Jan. 24, 2018.

(51) Int. Cl.
| | |
|---|---|
| *H04L 27/00* | (2006.01) |
| *H04L 27/06* | (2006.01) |
| *H03M 5/14* | (2006.01) |
| *H03M 5/08* | (2006.01) |
| *H03M 7/46* | (2006.01) |

(52) U.S. Cl.
CPC ............. *H03M 5/145* (2013.01); *H03M 5/08* (2013.01); *H03M 7/46* (2013.01)

(58) Field of Classification Search
CPC .......... H03M 5/145; H03M 5/08; H03M 5/20; H03M 7/46
USPC ......................... 375/253, 254, 256, 316, 340
See application file for complete search history.

(56) References Cited

U.S. PATENT DOCUMENTS

| | | | | |
|---|---|---|---|---|
| 7,620,116 B2* | 11/2009 | Bessios | ............... | H04L 25/4917 341/58 |
| 2003/0108134 A1* | 6/2003 | Stonick | .................... | H04B 3/32 375/353 |
| 2006/0109917 A1* | 5/2006 | Fonseka | .............. | H04L 25/4908 375/242 |
| 2019/0303340 A1* | 10/2019 | Lee | ...................... | G06F 13/4282 |
| 2019/0305765 A1* | 10/2019 | Lee | ...................... | G06F 13/4282 |

* cited by examiner

*Primary Examiner* — Tesfaldet Bocure
(74) *Attorney, Agent, or Firm* — Rowan TELS LLC

(57) ABSTRACT

A circuit includes a splitter to extract L bits from each of a plurality of N-bit transmissions on a data bus, a decoder to generate output data comprising N-L bits of each N-bit transmission, and a delay circuit to apply the L bits for a previous transmission to control the inversion of a current transmission at the decoder.

21 Claims, 10 Drawing Sheets

|        | d[0:1] | d[2:3] | d[4:5] | d[6:7] | d[8:9] | d[10:11] | d[12:13] | d[14:15] |
|--------|--------|--------|--------|--------|--------|----------|----------|----------|
| DQ[0]  | d0[0]  | d0[7:1] |       |        | d0[8]  | d0[15:9] |          |          |
| DQ[1]  | d1[0]  | d1[7:1] |       |        | d1[8]  | d1[15:9] |          |          |
| DQ[2]  | d2[0]  | d2[7:1] |       |        | d2[8]  | d2[15:9] |          |          |
| DQ[3]  | d3[0]  | d3[7:1] |       |        | d3[8]  | d3[15:9] |          |          |
| DQ[4]  | d4[0]  | d4[7:1] |       |        | d4[8]  | d4[15:9] |          |          |
| DQ[5]  | d5[0]  | d5[7:1] |       |        | d5[8]  | d5[15:9] |          |          |
| DQ[6]  | d6[0]  | d6[7:1] |       |        | d6[8]  | d6[15:9] |          |          |
| DQ[7]  | d7[0]  | d7[7:1] |       |        | d7[8]  | d7[15:9] |          |          |

RAW DATA 202

|       | s[0]  | s[1]  | s[2]  | s[3]  | s[4]  | s[5]  | s[6]  | s[7]  |
|-------|-------|-------|-------|-------|-------|-------|-------|-------|
| DQ[0] | c0[7:0] |     |       |       | c0[15:8] |   |       |       |
| DQ[1] | c1[7:0] |     |       |       | c1[15:8] |   |       |       |
| DQ[2] | c2[7:0] |     |       |       | c2[15:8] |   |       |       |
| DQ[3] | c3[7:0] |     |       |       | c3[15:8] |   |       |       |
| DQ[4] | c4[7:0] |     |       |       | c4[15:8] |   |       |       |
| DQ[5] | c5[7:0] |     |       |       | c5[15:8] |   |       |       |
| DQ[6] | c6[7:0] |     |       |       | c6[15:8] |   |       |       |
| DQ[7] | c7[7:0] |     |       |       | c7[15:8] |   |       |       |
| DBI   | d0[0] d1[0] | d2[0] d3[0] | d4[0] d5[0] | d6[0] d7[0] | d0[8] d1[8] | d2[8] d3[8] | d4[8] d5[8] | d6[8] d7[8] |

ENCODED DATA 204

FIG. 2

|       | d[0:1] | d[2:3] | d[4:5] | d[6:7] | d[8:9] | d[10:11] | d[12:13] | d[14:15] |
|-------|--------|--------|--------|--------|--------|----------|----------|----------|
| DQ[0] | d0[0]  | \multicolumn{3}{c|}{d0[7:1]} | | d0[8] | \multicolumn{3}{c|}{d0[15:9]} | | |
| DQ[1] | d1[0]  | d1[7:1] | | | d1[8] | d1[15:9] | | |
| DQ[2] | d2[0]  | d2[7:1] | | | d2[8] | d2[15:9] | | |
| DQ[3] | d3[0]  | d3[7:1] | | | d3[8] | d3[15:9] | | |
| DQ[4] | d4[0]  | d4[7:1] | | | d4[8] | d4[15:9] | | |
| DQ[5] | d5[0]  | d5[7:1] | | | d5[8] | d5[15:9] | | |
| DQ[6] | d6[0]  | d6[7:1] | | | d6[8] | d6[15:9] | | |
| DQ[7] | d7[0]  | d7[7:1] | | | d7[8] | d7[15:9] | | |

RAW DATA 202

|       | s[0]  | s[1]  | s[2]  | s[3]  | s[4]  | s[5]  | s[6]  | s[7]  |
|-------|-------|-------|-------|-------|-------|-------|-------|-------|
| DQ[0] | c0[7:0] | | | | c0[15:8] | | | |
| DQ[1] | c1[7:0] | | | | c1[15:8] | | | |
| DQ[2] | c2[7:0] | | | | c2[15:8] | | | |
| DQ[3] | c3[7:0] | | | | c3[15:8] | | | |
| DQ[4] | c4[7:0] | | | | c4[15:8] | | | |
| DQ[5] | c5[7:0] | | | | c5[15:8] | | | |
| DQ[6] | c6[7:0] | | | | c6[15:8] | | | |
| DQ[7] | c7[7:0] | | | | c7[15:8] | | | |
| DBI   | d0[0] d0[8] | d1[0] d1[8] | d2[0] d2[8] | d3[0] d3[8] | d4[0] d4[8] | d5[0] d5[8] | d6[0] d6[8] | d7[0] d7[8] |

ENCODED DATA 302

FIG. 3

EYE ENLARGEMENT
MTA ENCODING

NO ENCODING

MAXIMUM TRANSITION AVOIDANCE (MTA) ENCODING

CROSS-REFERENCE TO RELATED APPLICATIONS

This application claims priority and benefit as a divisional of U.S. application Ser. No. 16/124,085, filed on Sep. 6, 2018, the contents of which are incorporated herein by reference in their entirety. U.S. application Ser. No. 16/124,085 claims benefit under 35 U.S.C. 119 to U.S. application Ser. No. 62/621,056, entitled "MAXIMUM TRANSITION AVOIDANCE (MTA) ENCODING", filed on Jan. 24, 2018, which is incorporated herein by reference in its entirety.

BACKGROUND

Pulse-Amplitude Modulation 4-Level (PAM-4) signaling is being proposed for future graphic memory interfaces as a way to increase communication bandwidth between memory and other system components, such as central processing units (CPUs) and graphics processing units (GPUs). Due to its use of >2 voltage level signals, PAM-4 is more susceptible to noise introduced from ISI and crosstalk than are binary voltage level techniques such as PAM-2.

In telecommunication, inter-symbol interference (ISI) is a form of distortion of a signal in which one symbol interferes with subsequent symbols. This is a disruptive phenomenon as the previous symbols have a similar effect as noise, thus making the communication less reliable.

Crosstalk is any phenomenon by which a signal transmitted on one circuit or channel of a transmission system creates an undesired effect in another circuit or channel. Crosstalk is usually caused by undesired capacitive, inductive, or conductive coupling from one circuit or channel to another.

There is therefore a need for encoding that reduce the effects of ISI and crosstalk in PAM-4 systems.

BRIEF SUMMARY

Techniques are disclosed to reduce ISI and crosstalk in PAM-4 signaling systems. These techniques utilize Maximum Transition Avoidance (MTA) to eliminate maximum voltage transitions between PAM-4 symbols on the data lines. The data bus inversion (DBI) line of a PAM-4 bus is utilized to communicate encoded symbols, and a half-burst technique is applied to encode and communicate the PAM-4 symbols on the data lines.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 2 illustrates an embodiment of a 7-8 bit encoding 200.

FIG. 3 illustrates an embodiment of a 7-8 bit encoding 300.

DETAILED DESCRIPTION

Figure 1:
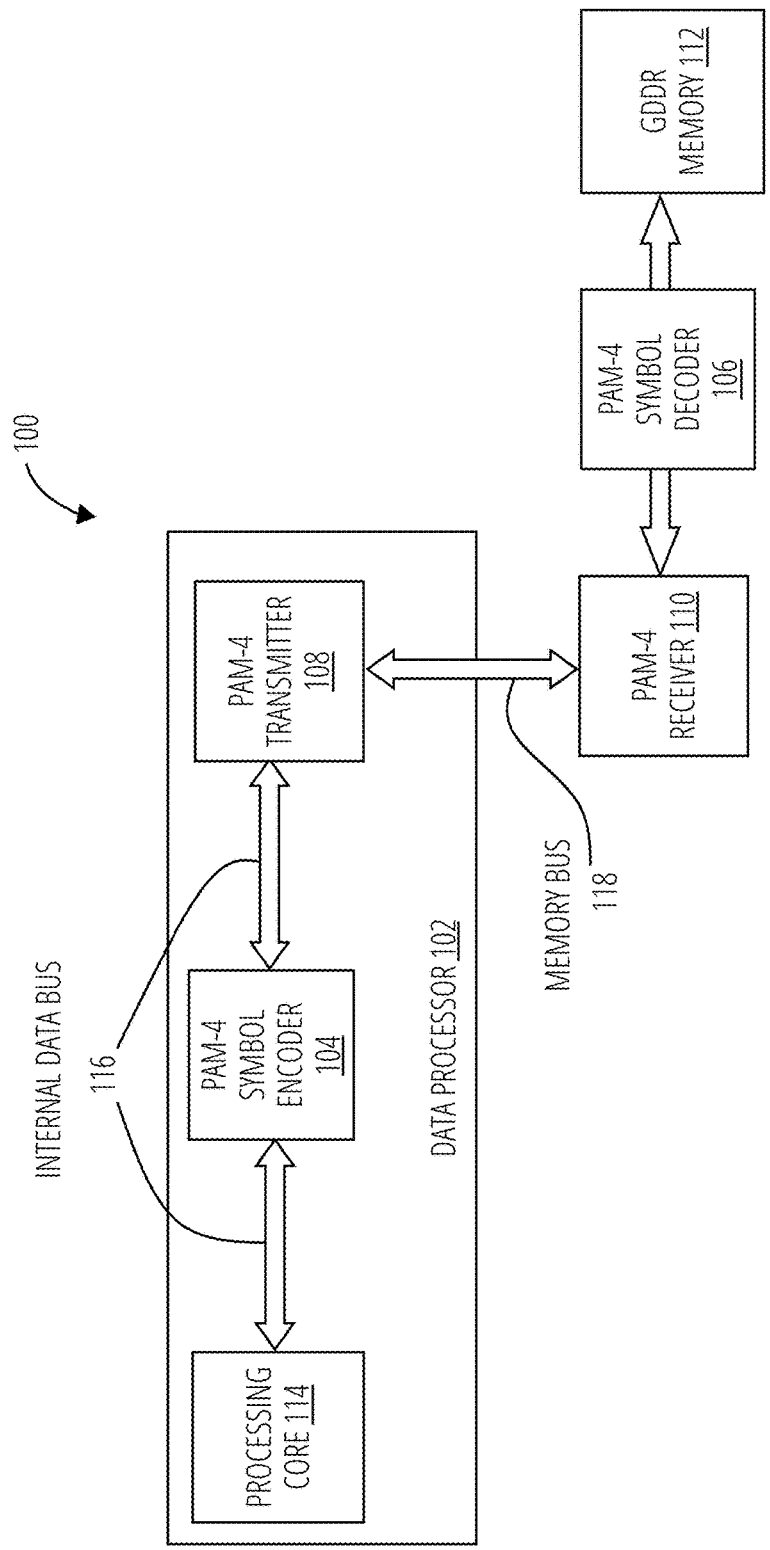
FIG. 1 illustrates a data communication system 100 in accordance with one embodiment.

Referring to FIG. 1, a data communication system 100 comprises a data processor 102 that includes comprises a processing core 114, PAM-4 symbol encoder 104, and a PAM-4 transmitter 108. The data processor 102 may in some embodiments comprise a GPU, a CPU, a system on a chip (SoC), or other well-known data processing systems and devices. The data processor 102 communicates with a graphics double data rate (GDDR) memory (GDDR memory 112) over a memory bus 118. A PAM-4 receiver 110 and PAM-4 symbol decoder 106 receive and process PAM-4 signals communicated from the data processor 102 to the GDDR memory 112 over the memory bus 118.

The data processor 102 utilizes an internal data bus 116 to transmit data bursts to and from the processing core 114. The PAM-4 symbol encoder 104 receives a burst to encode from the processing core 114 and performs encoding on that burst. The PAM-4 transmitter 108 transmits the encoded burst to the PAM-4 receiver 110 via the memory bus 118. The PAM-4 receiver 110 receives the encoded burst and sends the encoded burst to the PAM-4 symbol decoder 106 to decode the burst. Once decoded, the burst is sent to the GDDR memory 112.

This is a simplified diagram. In practice, there would typically be encoders and decoders on both ends of the memory bus 118 for both writing to and reading from the GDDR memory 112.

FIG. 2 illustrates an embodiment of 7-8 bit encoding 200. For both the raw data 202 and the encoded data 204, each row DQ[i] represents a serial data line. In the raw data 202 the columns are sequential 2-bit positions in 16-bit data bursts. For example, the second and third bits of each data burst are represented in the column labeled d[2:3]. Each data burst is represented on each serial data line DQ as two ½ bursts of 8-bits each. For example, on serial data line DQ[0], the 16-bit data burst is divided into a first ½ burst d0[0]d0[7:1] and a second ½ burst d0[8]d0[15:9]. Each ½ burst is further divided into a 1-bit:7-bit pair. For example, on serial data line DQ[0] the first ½ burst d0[0]d0[7:1] is divided into the 1-bit value d0[0] and the 7-bit value d0[7:1]. The raw data is not actually transmitted on the serial data line, and the depictions of raw data in FIG. 2 and FIG. 3 are merely to show how the raw data is divided up for encoding.

Referring now to the encoded data 204, the rows are once again the serial data lines, but now the columns are bit strings representing symbols. For example, s[0] represents the first 2-bit PAM-4 symbol on each serial data line, s[1] represents the second 2-bit PAM-4 symbol on each serial data line, and so on. The 7-8 bit encoding 200 encodes pairs of the 1-bit raw data values from different serial data lines as PAM-4 symbols on the DBI serial data path. The remaining 7-bits of each ½ data burst are encoded into four PAM-4 symbols (8-bits, called herein a codeword) on the corresponding serial data line. For example, d0[7:1] is encoded as codeword c0[7:0] on DQ[0]. The codeword for each 7-bits of raw data represent four PAM-4 symbols. The mapping of 7-bit raw data values into codewords is performed according to an algorithm/mapping that avoids maximum transitions between the PAM-4 domain voltage levels generated for the codewords on the serial data lines. An embodiment of this algorithm/mapping is described in more detail below.

The 7-8 bit encoding 200 and 7-8 bit encoding 300 illustrate an implementation in which the first bit of each ½ burst is extracted and encoded into a symbol on the DBI serial data line. In the exemplary encoded data 204, d0[0] and d1[0] are encoded as a 2-bit PAM-4 symbol on the DBI serial data line. Likewise, d2[0] and d3[0] are encoded as a 2-bit PAM-4 symbol on the DBI serial data line, and so on. FIG. 3 illustrates a different 7-8 bit encoding 300 embodiment to generate encoded data 302, in which d0[0] and d0[8] are encoded as a 2-bit PAM-4 symbol on the DBI serial data line, d1[0] and d1 [8] are encoded as a 2-bit PAM-4 symbol on the DBI serial data line, and so on. In general, any pairing of the 1-bit values from the serial data lines (referred to herein as interleaving) may be utilized to form the PAM-4 symbols on the DBI serial data line. In general, any bit position from each ½ burst may be the 1-bit value that is encoded into a symbol on the DBI serial data line, not just bit 0 and/or bit 8 as illustrated herein for example.

The following mapping table is used in the following description to describe the codewords. This is merely one non-limiting example for purposes of illustration.

| Code | −3 | −1 | +1 | +3 |
|---|---|---|---|---|
| Symbol bits | 00 | 01 | 11 | 10 |
| Line voltage (as % of supply voltage) | 50% | 66% | 83% | 100% |

For any given ½ burst there are 139 PAM-4 codewords that do not have internal −3 to +3 transitions and that have a pattern of {+3,+1,−1} or {−3,−1,+1}. Because only 7-bits or each ½ burst are encoded, only 128 of the 139 possible codewords with these transitions are needed to implement the maximum transition avoidance techniques described herein.

In one embodiment the encoder is configured to assume assumes that the final (4th) symbol of the previous codeword is +3, +1, or −1 (but cannot be −3), and the following codeword is inverted if the most significant bit (MSB) of the previous codeword is 1. In this description the MSB of the final symbol of the first codeword of a pair of codewords for a full raw data burst is denoted by cx[0] and the MSB of the second codeword is denoted by cx[8], where x is the number of the serial data line DQ on which the codeword is transmitted or received.

These techniques avoid a maximum transition event (+3⇒−3 or −3⇒+3) between blocks of symbols. In one embodiment, the data bus idles at +3 so that the first symbol of an encoded block can be +3, +1, −1 but not −3. However there is no restriction on the values of the last symbol of an encoded block, and thus the last symbol in an encoded block can in theory be at −3, −1, +1 or +3. The encoding selectively inverts the symbols at block boundaries to avoid a −3 to +3 transition at the block boundaries. There are four possible symbols at the end of an encoded block: −3, −1, +1, +3. If the last symbol of the present encoded block is +1 or +3 (MSB a "1") then the next block is transmitted using the regular encoding table. If the last symbol of the present encoding block is a −3 or −1 ("MSB a "0") then the encoder applies complements of the output of the encoding block.

The handling of certain boundary cases is further described below.

The symbols placed on the DBI serial data line may have +3/−3 transitions with this technique and should be physically spaced from the data lines to an extent to avoid interference effects on the data.

Figure 4:
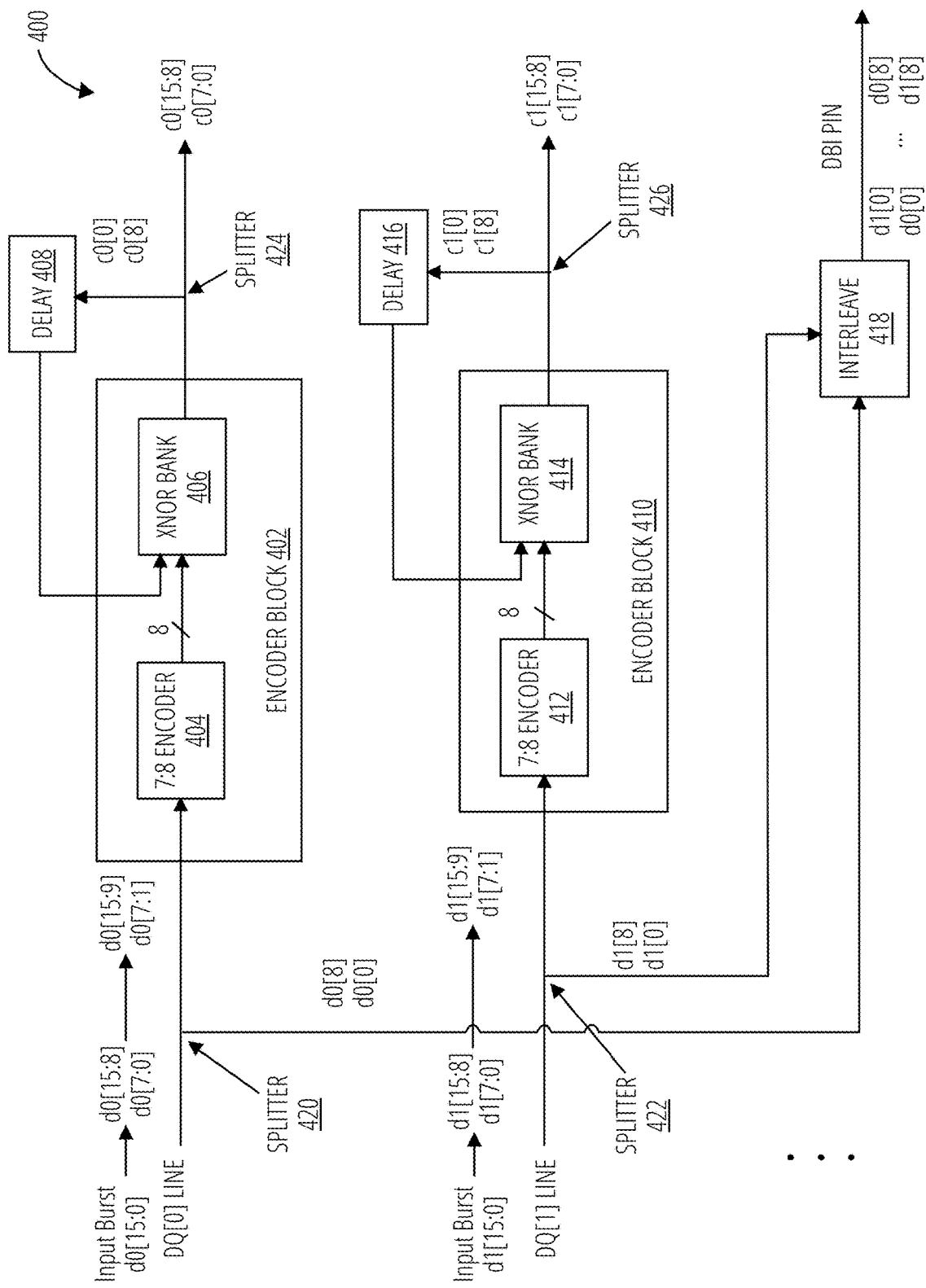
FIG. 4 illustrates an embodiment of an encoding architecture 400.

FIG. 4 depicts an encoding architecture 400 comprising an encoder block 402 that includes a 7:8 encoder 404 an XNOR bank 406, and a delay 408 for serial data line DQ[0], and an encoder block 410 comprising a 7:8 encoder 412, an XNOR bank 414, and a delay 416 for serial data line DQ[1]. A splitter 420 divides the bits at the input of encoder block 402, and a splitter 422 divides the bits at the input of encoder block 410. A splitter 424 divides the bits at the output of encoder block 402, and a splitter 426 divides the bits at the output of encoder block 410. This structure repeats for other data lines, which are not depicted for purposes of simplifying the description. The encoding architecture 400 also includes an interleave 418.

In one embodiment each XNOR bank comprises eight 2-input XNOR gates (the decoder embodiment shown in FIG. 6 uses the same structure) to selectively invert bits of a codeword that differ from the MSB of the immediately previous codeword that was sent or received. Each XNOR gate has a first input that is the MSB and a second input that is a bit from the codeword being operated on.

Figure 5:
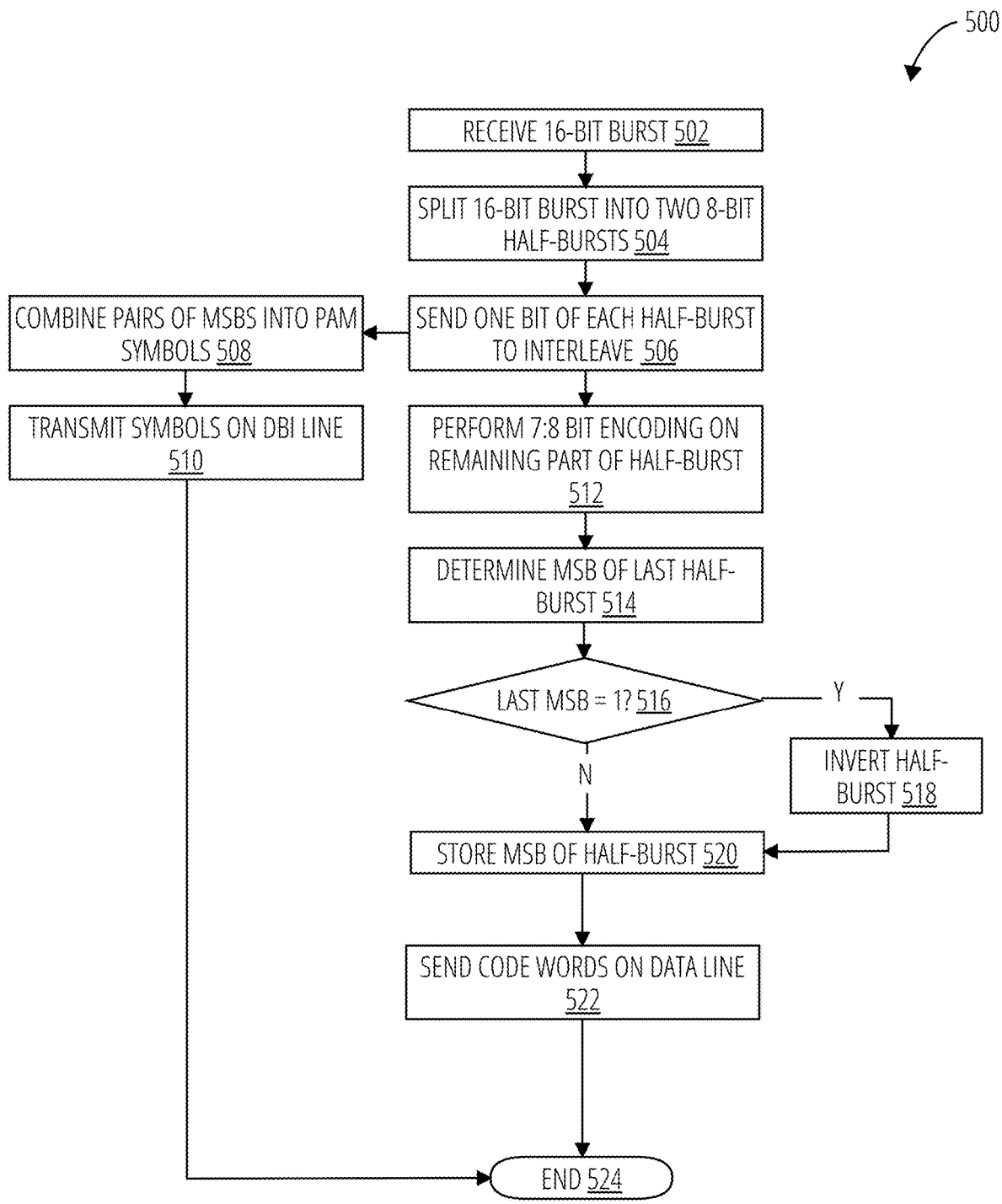
FIG. 5 illustrates an encoding process 500 in accordance with one embodiment.

The encoding architecture 400 may operate in accordance with the encoding process 500 illustrated in FIG. 5.

Referring to FIG. 5, an encoding process 500 receives a 16-bit burst for each line (block 502). In some embodiments, there are eight lines. The 16-bit burst is split into two 8-bit half-bursts (block 504). One bit of each half-burst for each line is then sent to an interleave (block 506) to be interleaved with similar bits from other data lines (block 508). The interleaved bits are then sent along the DBI line as PAM-4 symbols to the receiver (block 510).

The remaining 7-bit half-bursts are 7:8-bit encoded (block 512). A codebook may be utilized to perform the 7:8-bit encoding. The most significant bit (MSB) of the previous code word is determined (block 514). If the MSB is "1" (decision block 516), then the code word is inverted (block 518). The MSB of the current code word is stored for use with the next code word (block 520). The code words are then sent along the line as multi-level PAM-4 symbols (block 522). The encoding process 500 then ends (done block 524).

Figure 6:
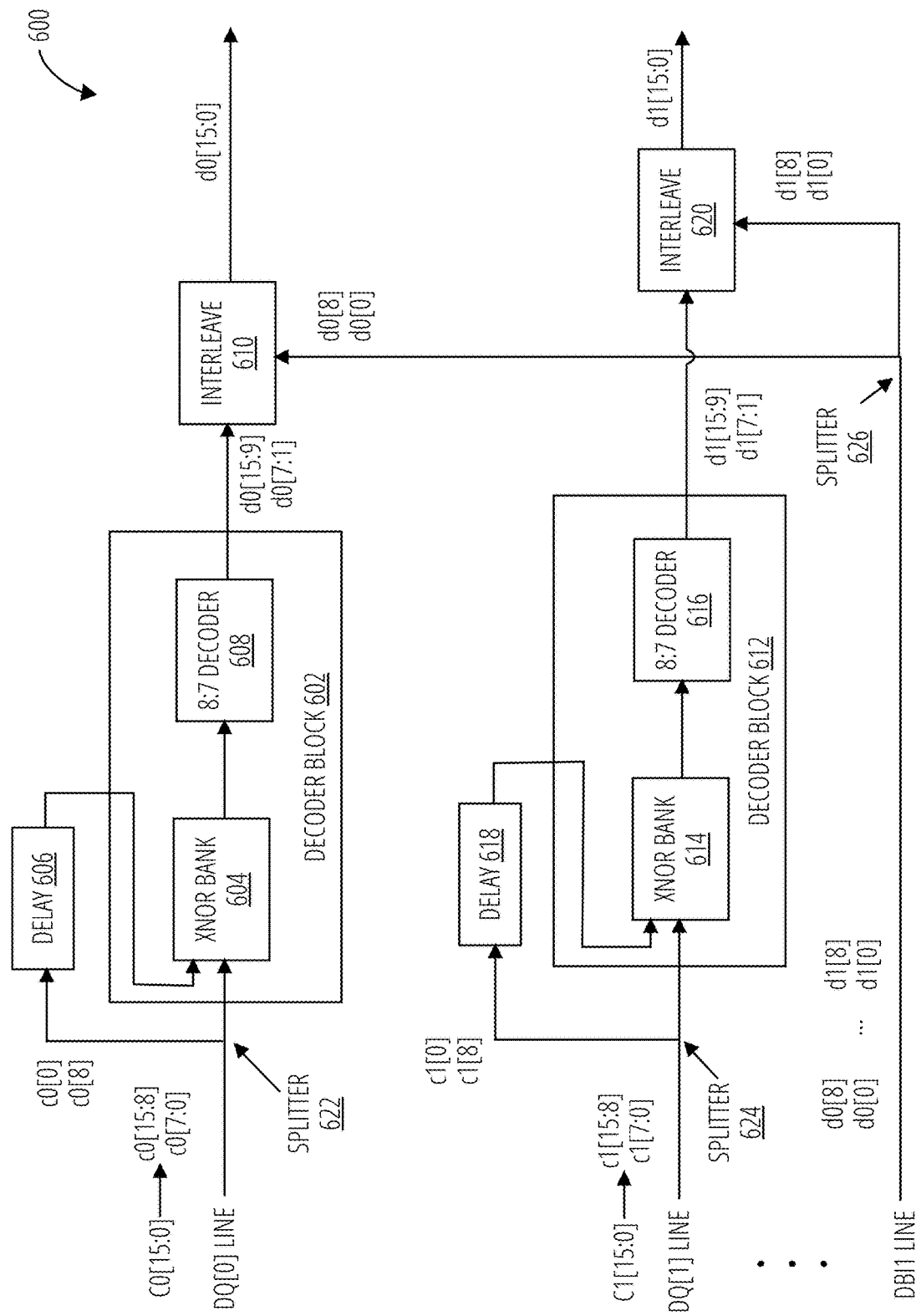
FIG. 6 illustrates an embodiment of a decoding architecture 600.

FIG. 6 shows a decoding architecture 600 corresponding to the encoding architecture 400 of FIG. 4. The decoding architecture 600 comprises a decoder block 602 for DQ[0] that includes an 8:7 decoder 608, an XNOR bank 604, a delay 606, and an interleave 610. A splitter 622 splits the input data signal to the decoder block 602. The decoder block 612 for DQ[1] likewise includes an 8:7 decoder 616, an XNOR bank 614, a delay 618, and an interleave 620. A splitter 624 splits the input data signal to the decoder block 612. A splitter 626 splits the input DBI signal to the interleavers. A similar structure is repeated for the data lines that aren't illustrated.

Figure 7:
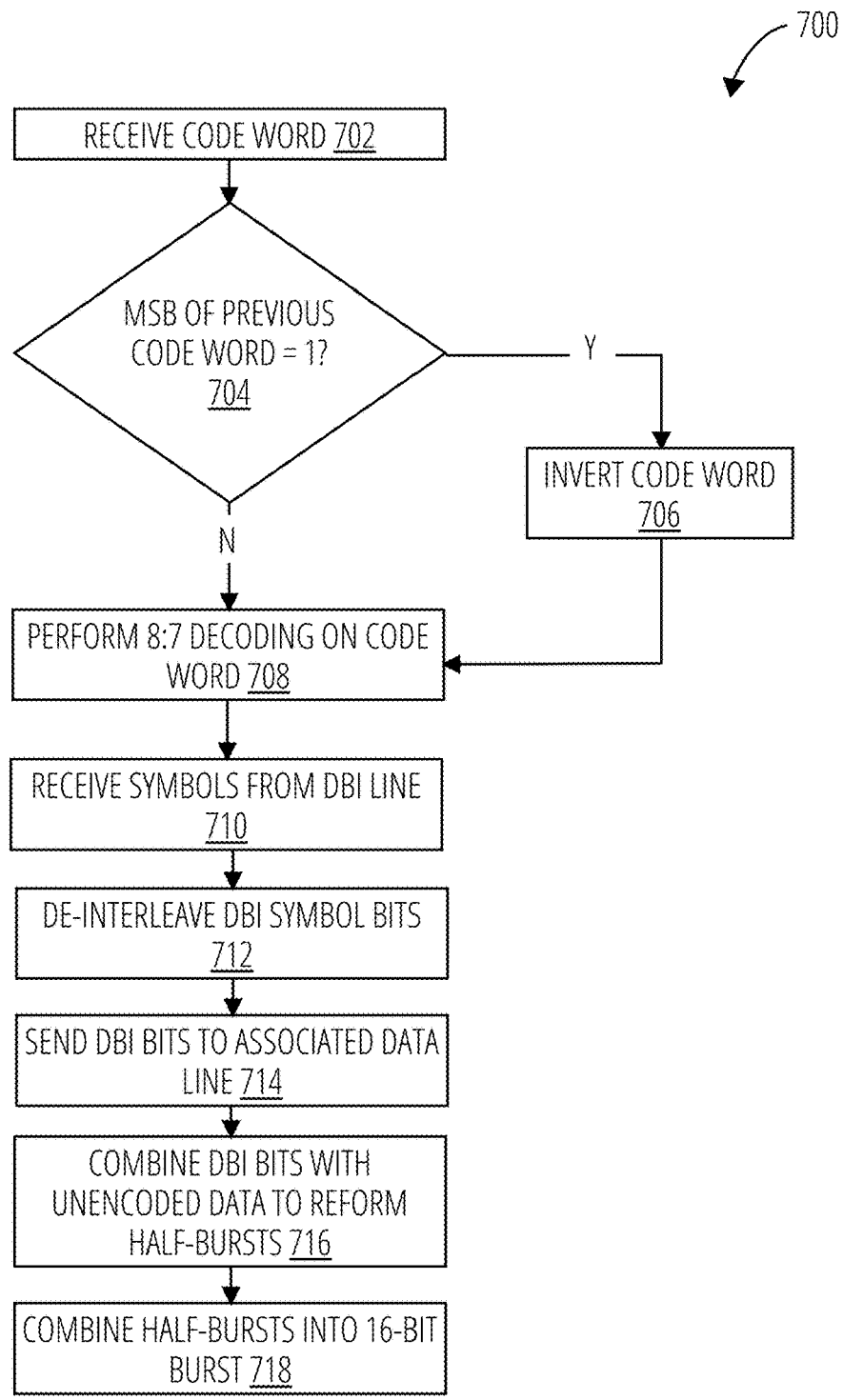
FIG. 7 illustrates a decoding process 700 in accordance with one embodiment.

The decoding architecture 600 may operate in accordance with the decoding process 700 illustrated in FIG. 7.

Referring to FIG. 7, a decoding process 700 receives the code word on a data line (block 702). The decoding process 700 determines whether the MSB of the previous code word is a "1" (decision block 704). If so, the current code word being processed is inverted (block 706). Once inverted or if no inversion is performed, 8:7 decoding is performed on the code word to recover the half-burst (block 708). The interleaved bits from the DBI line are received (block 710) and split off to the corresponding data lines (block 712), (block 714). The DBI bits are re-combined with their associated half-burst (block 716). The half-bursts for each line are then combined into the full burst for that line (block 718).

Figure 8:
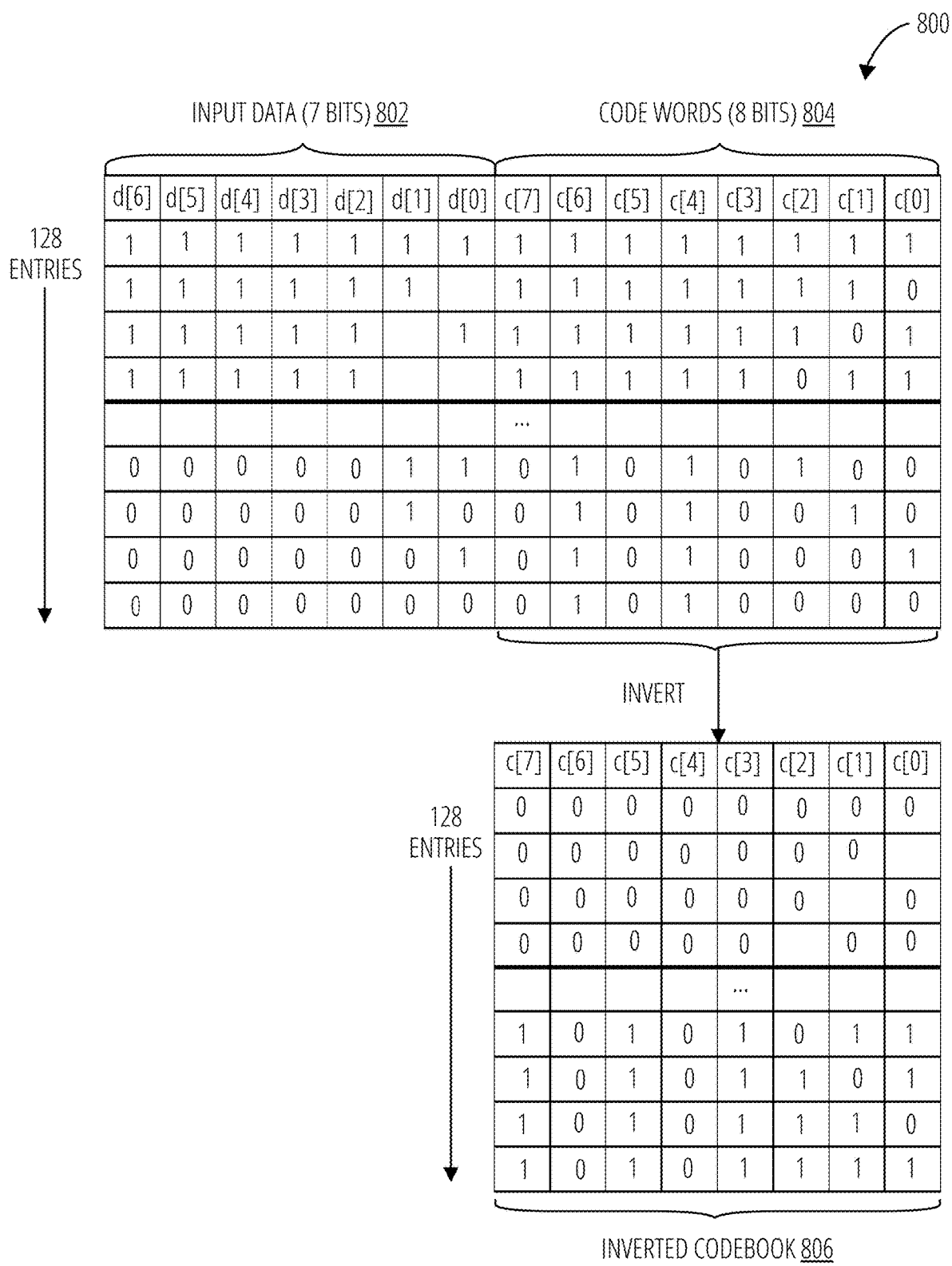
FIG. 8 illustrates an embodiment of a 7-8 bit codebook 800.

FIG. 8 illustrates an exemplary 7-8 bit codebook 800 and inverted codebook 806. The 7-8 bit codebook 800 illustration shows input data 802 and its mapping to code words 804. Each 7-bits half-burst of the input data 802 is mapped to an 8-bit value in the code words 804 by the 7:8 encoding. The inverted codebook 806 may be used to encode the input data 802 when the MSB of the previous code word was set to a predetermined value such as "1", as previously described. Whether or not an inverted codebook 806 is used, or whether the code word from the 7-8 bit codebook 800 is inverted using logic gates such as an XNOR bank 406, is a design choice based on required performance, circuit area, and possibly other considerations.

The 7-8 bit codebook 800 is generated to utilize transitions that avoid +3↔−3 (maximum transitions). Using recurrence relations:
a[i]: number of PAM-4 symbol sequences which end in −3
b[i]: number of PAM-4 symbol sequences which end in −1
c[i]: number of PAM-4 symbol sequences which end in +1
d[i]: number of PAM-4 symbol sequences which end in +3

Then, the recurrence relations are as follows. The a and d terms only include three relations as −3→+3 and +3→−3 are not utilized.
a[i]=a[i−1]+b[i−1]+c[i−1]
b[i]=a[i−1]+b[i−1]+c[i−1]+d[i−1]
c[i]=a[i−1]+b[i−1]+c[i−1]+d[i−1]
d[i]=b[i−1]+c[i−1]+d[i−1]

There are 139 possibilities for code words that do not result in +3/−3 transitions. From these, 128 are chosen as entries in the 7-8 bit codebook 800. There are two cases to consider when applying the codebook.
Case I: MSB of last symbol=1
Case II: MSB of symbol=0.

For Case I the last symbol of the burst is either +1 or +3, thus the first symbol of the subsequent burst should be restricted to {+3,+1,−1}. For Case II, the last symbol is either −3 or −1 and thus the subsequent first symbol is restricted to {−3,−1,+1}. It is unnecessary to maintain two separate code books, and sufficient to invert the codebook for different cases (e.g., where original case is MSB=0 and inverted case is MSB=1).

One way to study ISI in a data transmission system experimentally is to apply the received wave to the vertical deflection plates of an oscilloscope and to apply a sawtooth wave at the transmitted symbol rate R (R=1/T) to the horizontal deflection plates. The resulting display is called an eye pattern because of its resemblance to the human eye. The interior region of the eye pattern is called the eye opening. An eye pattern provides a great deal of information about the performance of the system. It is a tool for the evaluation of the combined effects of channel noise and inter-symbol interference on the performance on the transmission system. It is the synchronized superposition of all possible realizations of the signal of interest viewed within a particular signaling interval.

1. The width of the eye opening defines the time interval over which the received wave can be sampled without error from ISI. The preferred time for sampling is the instant of time at which the eye is open widest.
2. The sensitivity of the system to timing error is determined by the rate of closure of the eye as the sampling time is varied.
3. The height of the eye opening, at a specified sampling time, defines the margin over noise.

The noise margin—the amount of noise required to cause the receiver to get an error—is given by the distance between the signal and the zero-amplitude point at the sampling time; in other words, the further from zero at the sampling time the signal is the better. For the signal to be correctly interpreted, it must be sampled somewhere between the two points where the zero-to-one and one-to-zero transitions cross. Again, the further apart these points are the better, as this means the signal will be less sensitive to errors in the timing of the samples at the receiver.

Figure 9:
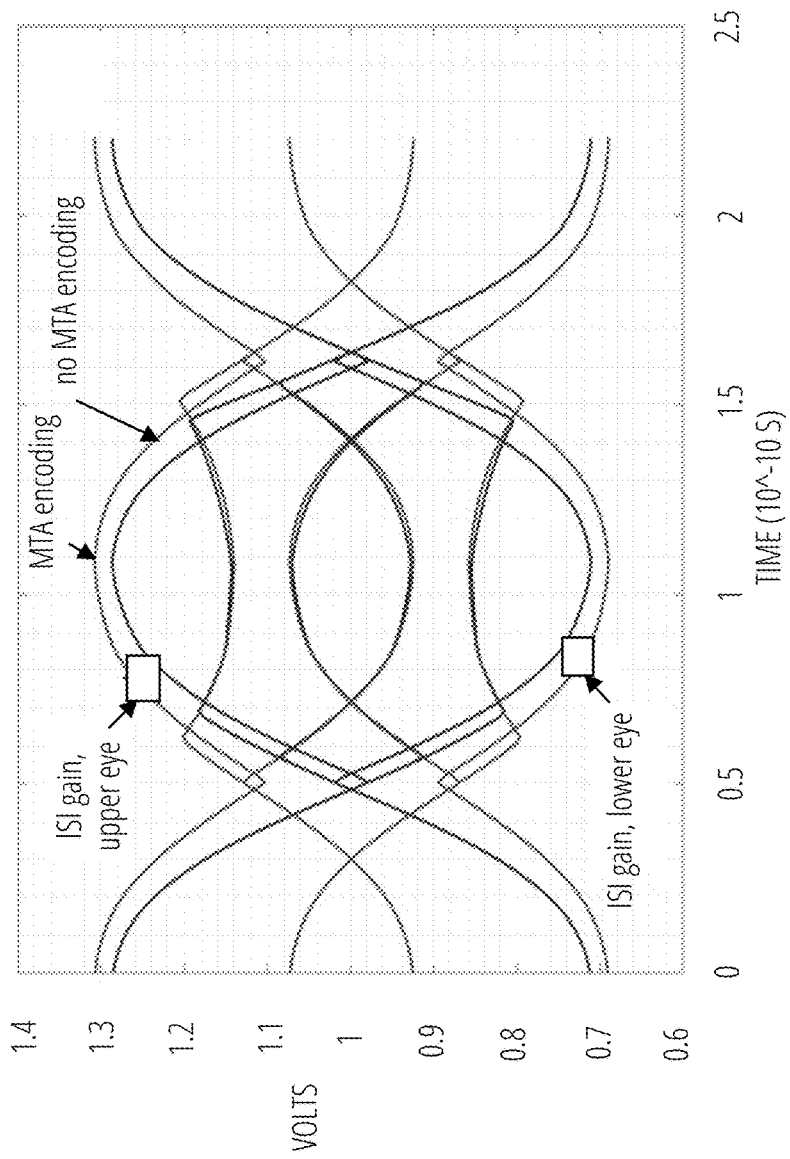
FIG. 9 illustrates an embodiment of an eye diagram 900.
Figure 10:
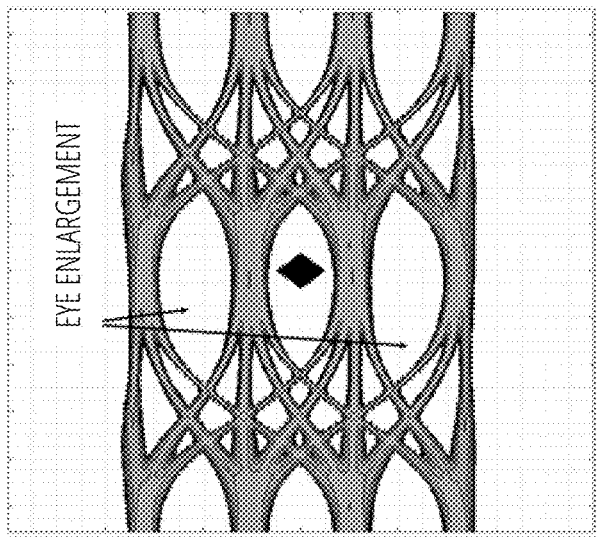
FIG. 10 illustrates an embodiment of an eye diagram 1000.
Figure 10:
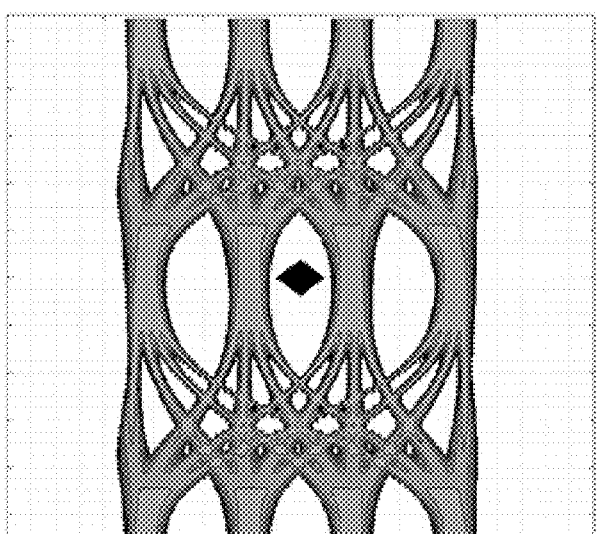

Referring to FIG. 9 and FIG. 10, the techniques described herein enlarge the upper and lower eyes (eye diagram 900, eye diagram 1000) for PAM-4 transmissions over approaches that do not utilize the MTA encoding. The center eye may also enlarge depending on the positioning of the ISI cursors. Eye enlargement may be greater for frequencies above 20 Gbps.

What is claimed is:
1. A circuit comprising:
a splitter to extract one bit each from consecutive code words received on a data bus;
a decoder to generate data words from the code words;
a delay circuit to cause the extracted bits to be received by the decoder after a delay from the decoder receiving the code words; and
an interleaver to combine the data words from the decoder with bits received on a data bus inversion (DBI) line of the data bus.
2. The circuit of claim 1, wherein the code words are encoded as PAM-4 symbols on the data bus.
3. The circuit of claim 1, configured to apply one bit on the DBI line per each one of the code words.
4. The circuit of claim 3, the decoder configured to combine each one bit of the bits received on the DBI line with each one of the code words as a least significant bit of the each one of the code words.
5. The circuit of claim 1, wherein each of the code words comprises 8 bits.
6. The circuit of claim 5, the decoder configured to decode each of the 8 bits into a 7-bit data word.
7. The circuit of claim 1, further comprising:
logic to determine that a most significant bit (MSB) of a first of the code words is set; and
on condition that the MSB is set, invert a second of the code words.
8. The circuit of claim 1, configured to receive the bits on the DBI line as PAM-4 symbols.
9. The circuit of claim 8, configured to combine bits received in a PAM-4 symbol on the DBI line with code words from different data lines of the data bus.
10. The circuit of claim 1, configured to receive bits on the DBI line for code words from different data lines of the data bus as interleaved PAM-4 symbols.
11. The circuit of claim 1, configured to combine bits received as a PAM-4 symbol on the DBI line with code words from a same data line of the data bus.
12. A circuit comprising:
a splitter to extract L bits from each of a plurality of N-bit transmissions on a data bus wherein L is less than N;
a decoder to generate output data comprising N-L bits of each N-bit transmission; and a delay circuit to apply the L bits extracted from a first N-bit transmission to control inversion of a second N-bit transmission at the decoder, the first N-bit transmission preceding the second N-bit transmission.

13. The circuit of claim 12, further comprising:
an interleaver to insert L bits from a data bus inversion (DBI) line into the output data.

14. A digital receiver comprising:
an input for a multi-line data bus;
a decoder comprising:
   a first input coupled to the multi-line data bus;
   a second input coupled to the multi-line data bus via a delay circuit;
   a splitter to extract one bit each from consecutive code words received on the multi-line data bus;
   a decoder block to generate data words from the code words;
   the delay circuit to cause the extracted bits to be received by the decoder block after a delay from the decoder block receiving the code words; and
   an interleaver to combine the data words from the decoder block with bits received on a data bus inversion (DBI) line of the multi-line data bus.

15. The digital receiver of claim 14, wherein the decoder is configured to apply one bit on the DBI line to each of the code words.

16. The digital receiver of claim 15, wherein the decoder is configured to apply one bit of the bits received on the DBI line per each one of the code words as a least significant bit of the each one of the code words.

17. The digital receiver of claim 14, wherein each of the code words comprises 8 bits.

18. The digital receiver of claim 17, the decoder block configured to decode each of the 8 bits into a 7-bit data word.

19. The digital receiver of claim 14, further comprising:
logic to determine that a most significant bit (MSB) of a first of the code words is set; and
on condition that the MSB is set, invert a second of the code words.

20. The digital receiver of claim 14, configured to extract bits received in a PAM-4 symbol on the DBI line to code words on different data lines of the multi-line data bus.

21. The digital receiver of claim 14, configured to apply bits received in a PAM-4 symbol on the DBI line to code words from a same data line of the multi-line data bus.

* * * * *